(12) United States Patent
Kwong et al.

(10) Patent No.: US 10,403,782 B2
(45) Date of Patent: Sep. 3, 2019

(54) LASER SCRIBING OF THIN-FILM SOLAR CELL PANEL

(71) Applicant: Manufacturing Integration Technology Ltd, Techplace II (SG)

(72) Inventors: Kim Mone Kwong, Northshore Bungalows (SG); Teck Keong Boh, Singapore (SG); Kok Yeow Lim, Singapore (SG); Han Yong Lam, The Calrose (SG)

(73) Assignee: Manufacturing Integration Technology Ltd, Singapore (SG)

(*) Notice: Subject to any disclaimer, the term of this patent is extended or adjusted under 35 U.S.C. 154(b) by 135 days.

(21) Appl. No.: 15/431,782

(22) Filed: Feb. 14, 2017

(65) Prior Publication Data
US 2017/0229604 A1 Aug. 10, 2017

Related U.S. Application Data

(62) Division of application No. 13/122,963, filed as application No. PCT/SG2009/000367 on Oct. 7, 2009, now abandoned.

(51) Int. Cl.
| | |
|---|---|
| *B23K 26/00* | (2014.01) |
| *B23K 26/02* | (2014.01) |
| *H01L 21/00* | (2006.01) |
| *G02B 26/10* | (2006.01) |
| *H01L 31/18* | (2006.01) |
| *B23K 26/08* | (2014.01) |
| *B23K 26/40* | (2014.01) |

(Continued)

(52) U.S. Cl.
CPC ........ *H01L 31/1876* (2013.01); *B23K 26/083* (2013.01); *B23K 26/0869* (2013.01); *B23K 26/40* (2013.01); *H01L 31/04* (2013.01); *H01L 31/18* (2013.01); *B23K 2103/50* (2018.08); *B23K 2103/56* (2018.08); *G02B 26/10* (2013.01)

(58) Field of Classification Search
CPC .. B23K 2203/56; B23K 26/083; B23K 26/40; B23K 26/0869; B23K 2103/50; B23K 2103/56; B23K 26/00; B23K 26/02; B23K 26/03; H01L 31/1876; H01L 31/18; H01L 31/04; H01L 31/00; G02B 26/10
USPC .... 219/201, 121.67, 121.68, 121.75, 121.76, 219/121.78, 121.8, 121.83, 121.82, 219/121.85
See application file for complete search history.

(56) References Cited

U.S. PATENT DOCUMENTS

| | | | | |
|---|---|---|---|---|
| 2,245,407 | A | * | 6/1941 | Lignian .................. B21D 7/085 72/134 |
| 2009/0321397 | A1 | * | 12/2009 | Krishnaswami ... B23K 26/0838 219/121.68 |

* cited by examiner

*Primary Examiner* — Michael G Hoang
(74) *Attorney, Agent, or Firm* — Pyprus Pte Ltd

(57) ABSTRACT

A method for laser scribing of thin-films for the manufacture of solar cell panels comprises loading a workpiece with the transparent substrate facing downwards in an input station of a first machine; biasing a reference edge of the workpiece against a front and rear stopper associated with a linear drive; translating the workpiece back and forth between the input station and output station and firing two or more laser beams at a first frequency substantially vertically through a space between the input and output stations to pass through the transparent substrate of the workpiece to scribe parallel lines on the front electrodes with reference to the edge of the workpiece in contact with the front and rear stoppers; and indexing the two or more laser sources and repeating the back and forth translation of the work piece between the input and output stations.

11 Claims, 16 Drawing Sheets

(51) Int. Cl.
*H01L 31/04* (2014.01)
*B23K 103/00* (2006.01)

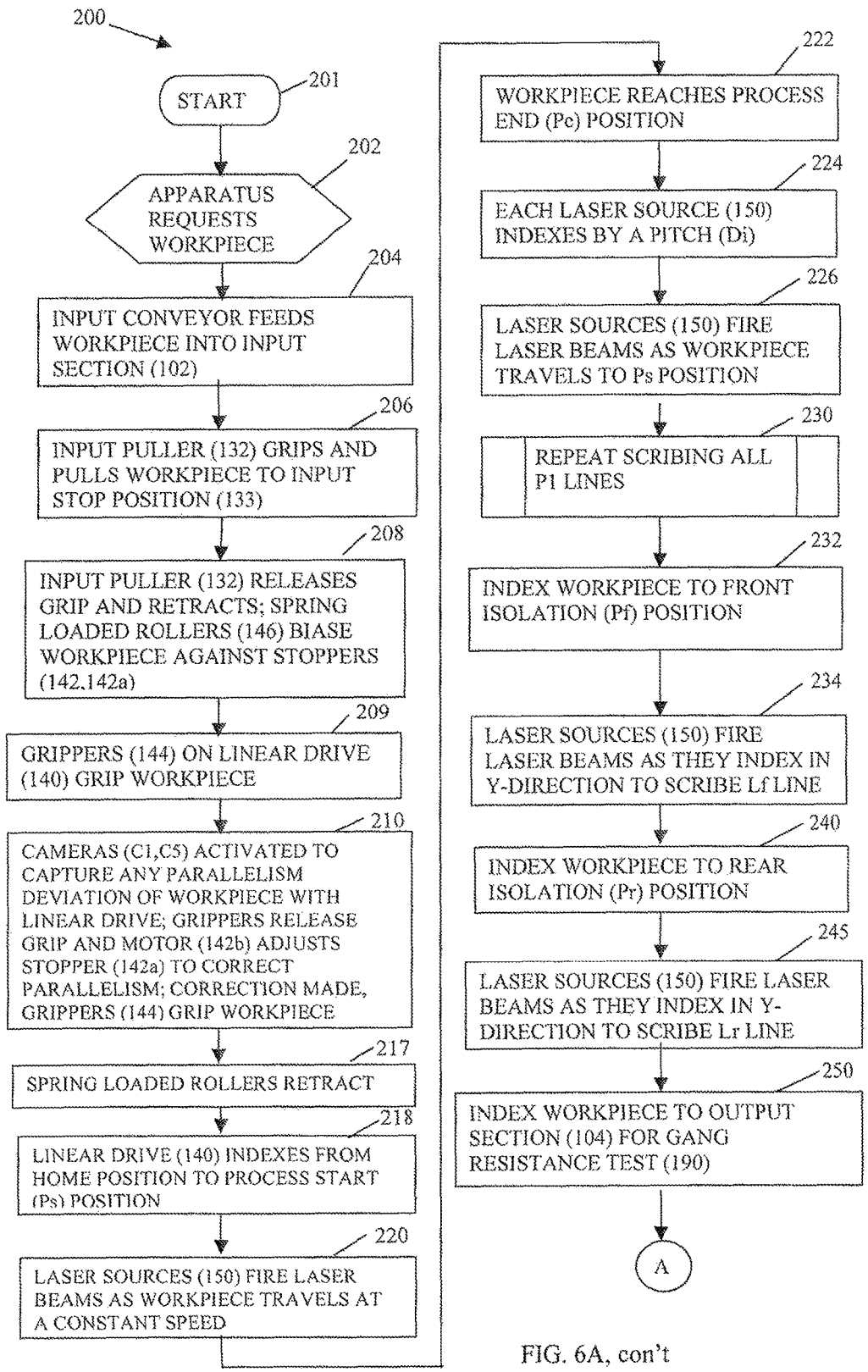
FIG. 6A, con't

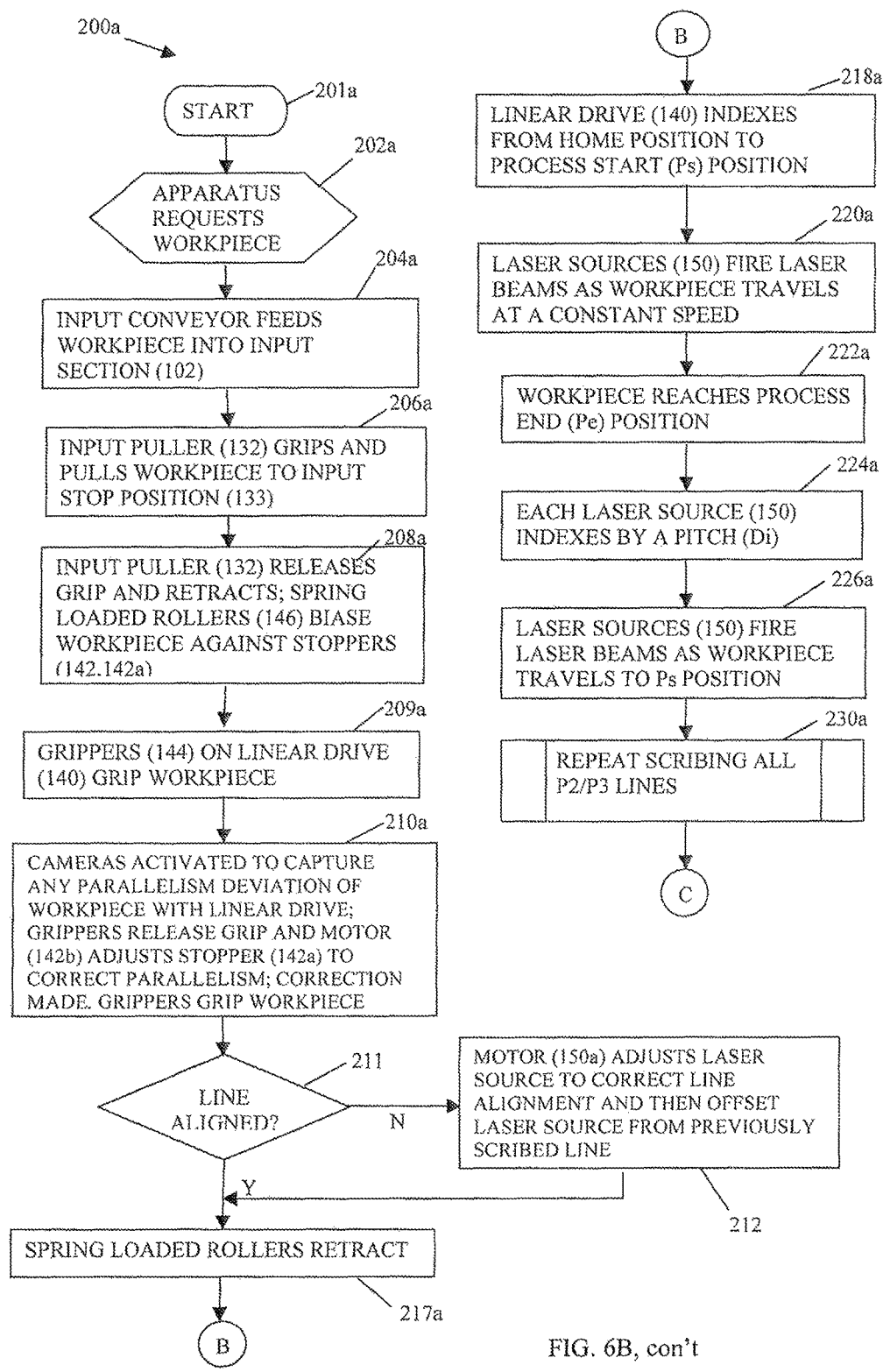
FIG. 6B, con't

LASER SCRIBING OF THIN-FILM SOLAR CELL PANEL

RELATED APPLICATIONS

The present invention is a divisional application of U.S. patent application Ser. No. 13/122,963 filed Apr. 6, 2011, which is a national phase application of International patent application no. PCT/SG2009/000367, filed Oct. 7, 2009, the disclosure of which is incorporated in its entirety.

FIELD OF INVENTION

The present invention relates to apparatuses and methods for laser scribing of thin-film solar cell panels.

BACKGROUND

A thin-film solar cell panel or module typically includes a transparent front electrode disposed on a glass substrate, a photovoltaically active layer containing a PN or PIN junction and a rear electrode. The front electrode is usually a transparent metal oxide such as tin oxide or zinc oxide. The simplest PIN junction includes a layer of a semiconductor material doped with a p-type dopant to form a P-layer, an undoped layer of a semiconductor material that forms an intrinsic or Mayer, and a layer of a semiconductor material doped with an n-type dopant to form an N-layer. Light incident on the substrate passes through the substrate, the front electrode and the photovoltaic layer, and a voltage is generated across the front and rear electrodes.

Typical methods for the manufacture of such thin-film solar cell panels use a laser to form a series of generally parallel grooves or scribes in the above-mentioned front electrode, semiconductor layer and rear electrode to divide the panel into a collection of individual, series connected cells. In one approach, as described in US 2008/0105303, laser beams are scanned across the panels to form parallel scribed lines. In another approach, the scribed lines were formed by moving the substrate containing the photovoltaic layer and electrodes under the laser beam. These known scribing processes tend to be slow.

Despite development in the art of forming parallel scribed lines on thin-film solar panels, there is a need for a new apparatus to meet volume production requirements of such solar panels and methods of use.

SUMMARY

The following presents a simplified summary to provide a basic understanding of the present invention. This summary is not an extensive overview of the invention, and is not intended to identify key features of the invention. Rather, it is to present some of the inventive concepts of this invention in a generalised form as a prelude to the detailed description that is to follow.

The present invention seeks to provide a system and method for laser scribing of thin-films for the manufacture of solar cell panels.

In one embodiment, the present invention provides a system comprising: an input section; an output section; a processing section between the input and output sections; grippers associated with a linear drive operable to grip on a workpiece, wherein the linear drive is operable to translate the workpiece between the input and output sections; and two or more laser sources disposed in a lower part of the processing section such that each laser source is operable to fire a laser beam upwardly through a transparent substrate of the workpiece to scribe the relevant layer of the thin-film solar panel as the workpiece is being translated between the input and output sections, with each laser source being independently indexable after each scribed line is formed so that the relevant thin-film layer is divided into substantively parallel strips, which are electrically isolated one from another.

In another embodiment, the present invention provides a method comprising: loading a workpiece with the transparent substrate facing downwards in an input station of a first machine; biasing a reference edge of the workpiece against a front and rear stopper associated with a linear drive, wherein the linear drive is operable to translate the workpiece between the input station and an output station; translating the workpiece back and forth between the input station and output station and firing two or more laser beams at a first frequency substantially vertically through a space between the input and output stations to pass through the transparent substrate of the workpiece to scribe parallel lines on the front electrodes with reference to the edge of the workpiece in contact with the front and rear stoppers, wherein each of laser beams is outputted from a separate laser source; and indexing the two or more laser sources and repeating the back and forth translation of the work piece between the input and output stations until the entire front electrode is divided into parallel strips that are electrically isolated one from another.

The method of the present invention further comprising: loading the workpiece formed with parallel strips of front electrodes in an input station of a second machine; biasing the workpiece against a front stopper and a rear adjustable stopper associated with a linear drive similar to that of the first machine, wherein the linear drive is operable to translate the workpiece between the input station and an output station; aligning a scribed line Lp1 on the front electrode with the linear drive by using a camera disposed at the front edge of the workpiece and another camera disposed near the rear adjustable stopper to determine the correction required to achieve parallelism; translating the workpiece back and forth between the input station and output station and firing two or more laser beams at a second frequency substantially vertically through a space between the input and output stations to pass through the transparent substrate of the workpiece to scribe parallel lines (Lp2, Lp3) on the semiconductor layer or rear electrode with reference to the scribed lines (Lp1) on the front electrode, wherein each of the laser beams is outputted from a separate laser source; and indexing the two or more laser sources and repeating the back and forth translation of the work piece between the input and output stations until the entire semiconductor layer or rear electrode is divided into parallel strips that are electrically isolated one from another.

In another embodiment of the present invention, the method comprises: loading a workpiece with the transparent substrate facing downwards in an input station of a machine; biasing the workpiece against a front stopper and a rear adjustable stopper associated with a linear drive; wherein the linear drive is operable to translate the workpiece between the input station and an output station; aligning a reference line on a reference edge of the workpiece with the linear drive by using a camera (C1-C4) disposed near the front edge of the workpiece and another camera (C5) disposed near the rear adjustable stopper to determine the correction required to achieve parallelism between the reference line and the linear drive; translating the workpiece back and forth between the input station and output station and firing two or more laser beams at a first frequency substantially vertically, through a space between the input and output stations, through the transparent substrate of the workpiece to scribe parallel lines on the front electrode; wherein each of the laser beams is outputted from a separate laser source; indexing the two or more laser sources and repeating the back and forth translation of the work piece between the input and output stations until the entire front electrode is divided into parallel strips that are electrically isolated one from another; aligning a scribed line (Lp1) on the front electrode with the linear drive by using the camera (C1-C4) disposed near the front edge of the workpiece and the another camera (C5) disposed near the rear adjustable stopper to determine the correction required to achieve parallelism; translating the workpiece back and forth between the input station and output station and firing two or more laser beams at a second frequency substantially vertically, through a space between the input and output stations, through the transparent substrate of the workpiece to scribe parallel lines (Lp2,Lp3) on the semiconductor layer or rear electrode; wherein each of the laser beams is outputted from a separate laser source; and indexing the two or more laser sources and repeating the back and forth translation of the work piece between the input and output stations until the entire semiconductor layer or rear electrode is divided into parallel strips that are electrically isolated one from another.

In one embodiment, each laser source is independently indexable by separate ballscrew and associated motor. In another embodiment, the rear stopper is adjustable through a ballscrew and an associated motor. In another embodiment, workpiece parallelism alignment is carried out manually with a dummy workpiece; in another, the camera or cameras are mounted on independently motorized axes disposed transverse to the scribed lines and workpiece parallelism alignment is carried out automatically. In yet another embodiment, workpiece parallelism alignment and laser source/camera alignment are carried out with a precision jig.

BRIEF DESCRIPTION OF THE DRAWINGS

This invention will be described by way of non-limiting embodiments of the present invention, with reference to the accompanying drawings, in which.

DETAILED DESCRIPTION

Figure 1A:
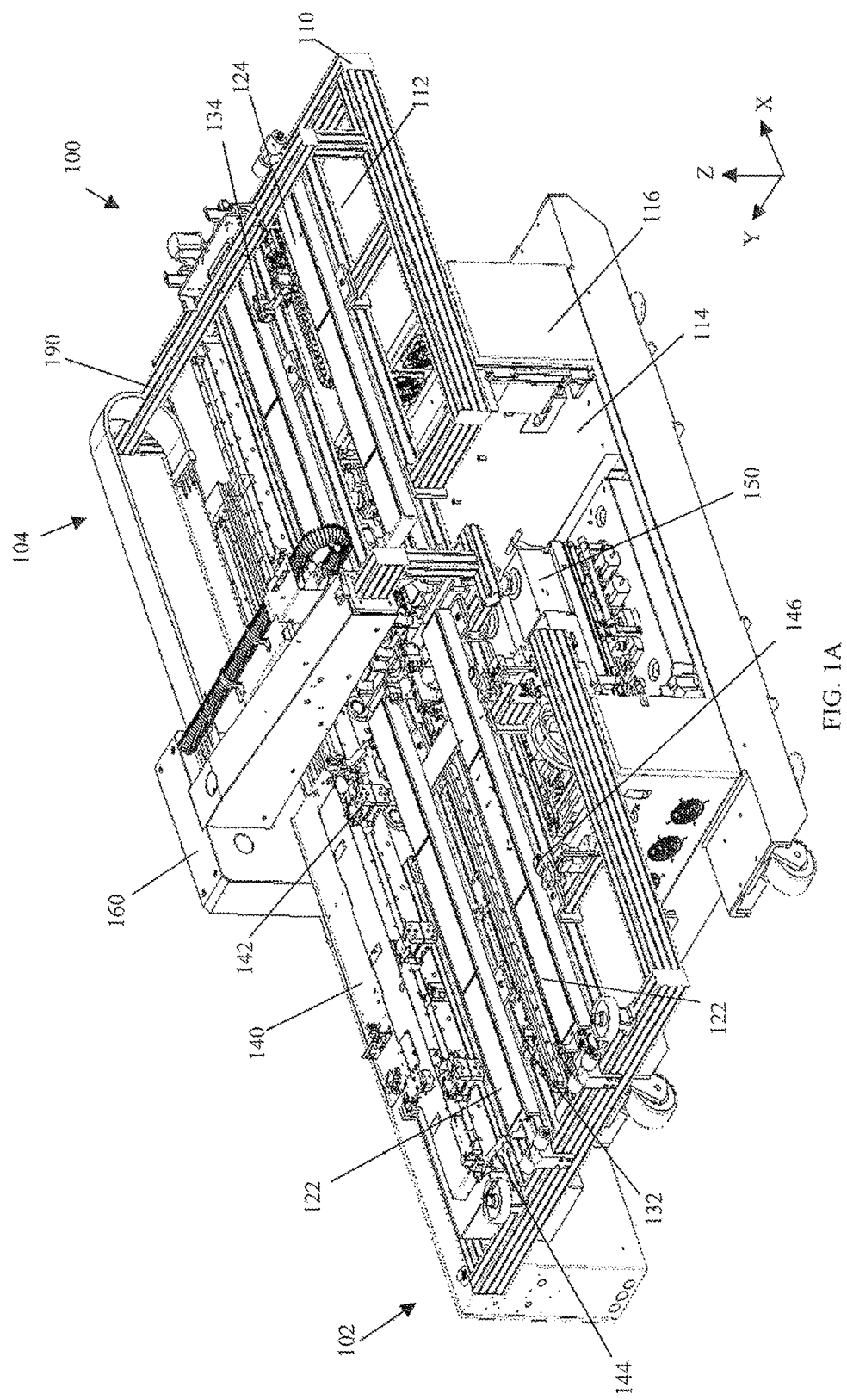
FIG. 1A shows an apparatus for laser scribing of the front electrodes according to an embodiment of the present invention.

One or more specific and alternative embodiments of the present invention will now be described with reference to the attached drawings. It shall be apparent to one skilled in the art, however, that this invention may be practised without such specific details. Some of the details may not be described at length so as not to obscure the invention. For ease of reference, common reference numerals or series of numerals will be used throughout the figures when referring to the same or similar features common to the figures.

Figure 1B:
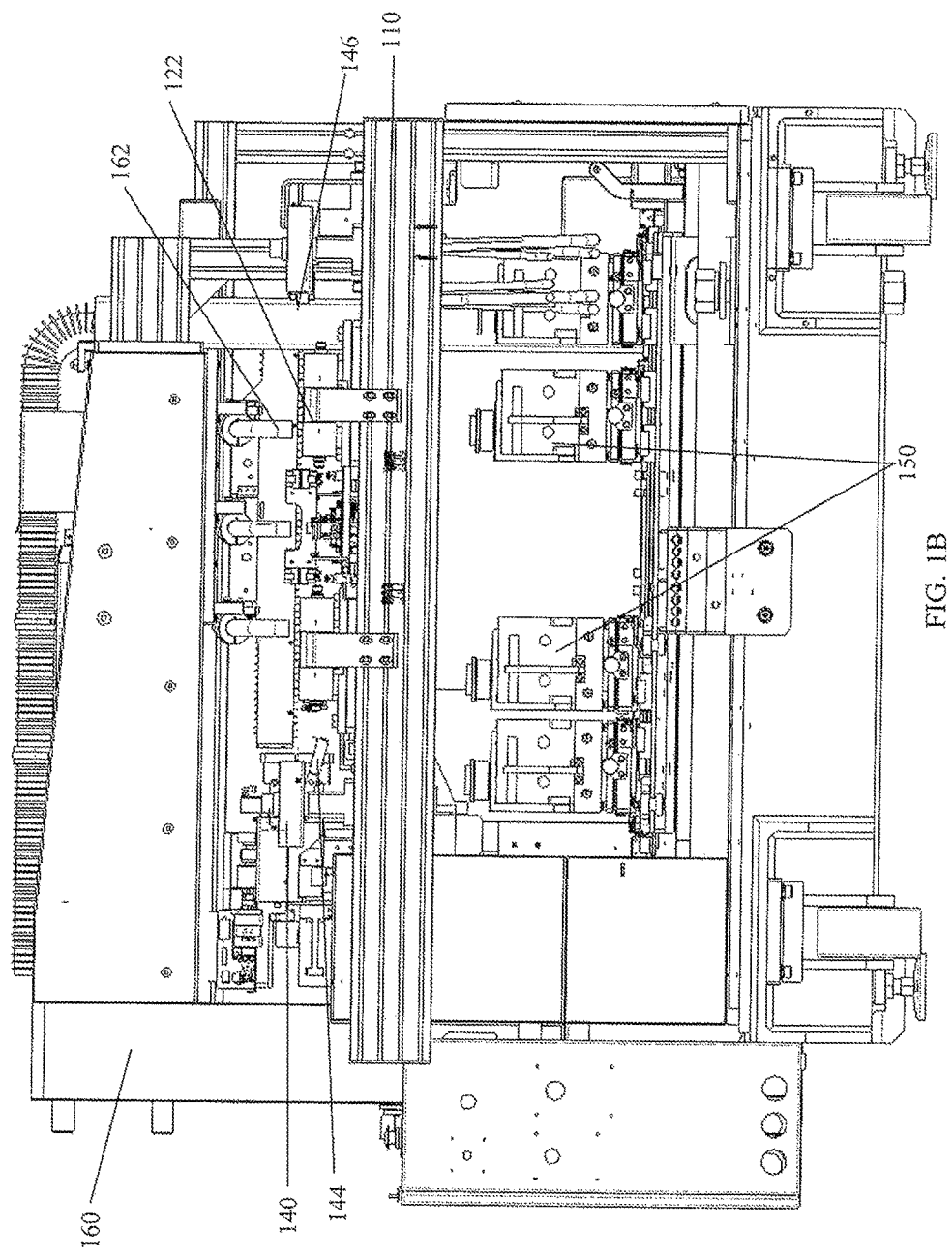
FIG. 1B illustrates an end view of the apparatus shown in FIG. 1A.

FIG. 1A shows a top perspective view of a laser scribing apparatus 100 according to an embodiment of the present invention. As shown in FIGS. 1A-1B, the laser scribing apparatus 100 includes a frame 110. The frame 110 has an upper platform 112, a lower platform 114 and a number of columns 116 joining the upper platform 112 to the lower platform 114. As seen in FIGS. 1A and 1B, the left hand side of the apparatus 100 is an input section 102, to which an external conveyor may dock with; the right hand side is an output section 104 of the apparatus. In each of the input and output sections 102,104, there are two rows of respective air bearings 122,124. Preferably, the input air bearings 122 are in line with the output air bearings 124 such that a workpiece W, for example the glass substrate S of 635 mm×1400 mm, is movable on air cushions between the substrate and the input/output air bearings 122,124. In between the two input air bearings 122, there is an input puller 132; in between the output air bearings 124, there is an output pusher 134. The input puller 132 and output pusher 134 are operable to travel linearly in the respective section to pull or push the workpiece W along the respective air bearings. On the far side of the apparatus 100 as seen in FIG. 1A, i.e. the left hand side of the workpiece W, there is a linear drive 140. The linear drive 140 extends from the input section 102 to the output section 104 in an x-direction as indicated by the right hand coordinate system shown in FIG. 1A such that the linear drive 140 is substantially parallel to the input puller 132 and output pusher 134. The linear drive 140 has at least two spaced apart grippers 144 connected thereto. The grippers 144 are operable to grip the left hand edge of the workpiece W and to transfer the workpiece to and forth between the input and output sections 102,104 whilst the workpiece is floating on the input and output air bearings 122,124. Above the upper platform 112 and in between the input and output sections 102,104, there is a gantry 160. The gantry 160 has a span to allow the workpiece W to move unobstructively between the input and output sections 102,104. Substantively below the gantry 160 and on the lower platform 114, there are four laser sources 150. Each laser source 150 emits a laser beam upwards through a space between the input and output sections 102,104 to scribe the workpiece W. The laser sources 150 are individually operable to index at predetermined pitches di transversely with respect to the left hand edge of the workpiece W, i.e in the negative y-direction as shown in FIG. 1A, so that substantially parallel scribed lines Lp1,Lp2,Lp3 can be formed in four bands B1-B4 on the workpiece W with respect to the first, second and third laser scribing processes P1,P2,P3 on the three respective major layers on a solar cell panel. On the gantry 160, four suction nozzles 162 associated with the four laser sources 150 are provided to remove any debris that may be generated during the laser scribing process.

Associated with the linear drive 140, there are two fixed stoppers 142 against which the far side, as seen in FIG. 1A, or left hand side of the workpiece W is referenced to. In order to ensure that the workpiece W is always in contact with the fixed stoppers 142, two spring-loaded rollers 146 are provided on the right hand side of the input section 102 to bias the workpiece against the fixed stoppers 142. Once the workpiece is biased against the fixed stoppers 142, the grippers 144 are operable to grip the left hand edge of the workpiece W to translate the workpiece at constant speed between the input and output sections 102,104 for laser scribing of parallel lines Lp1,Lp2,Lp3 thereon. After parallel lines Lp1 are formed on the workpiece, front and rear isolation lines Lf,Lr are separately formed transversely to the parallel scribed lines Lp1. Strip of the isolated front electrodes are checked by a resistance tester 190 at the output section 104 to ensure that each of the strips is electrically isolated one from another. After each of the laser scribing process P1,P2,P3 is performed, each workpiece W is removed from the output section 104 for cleaning or further processing.

Figure 2A:
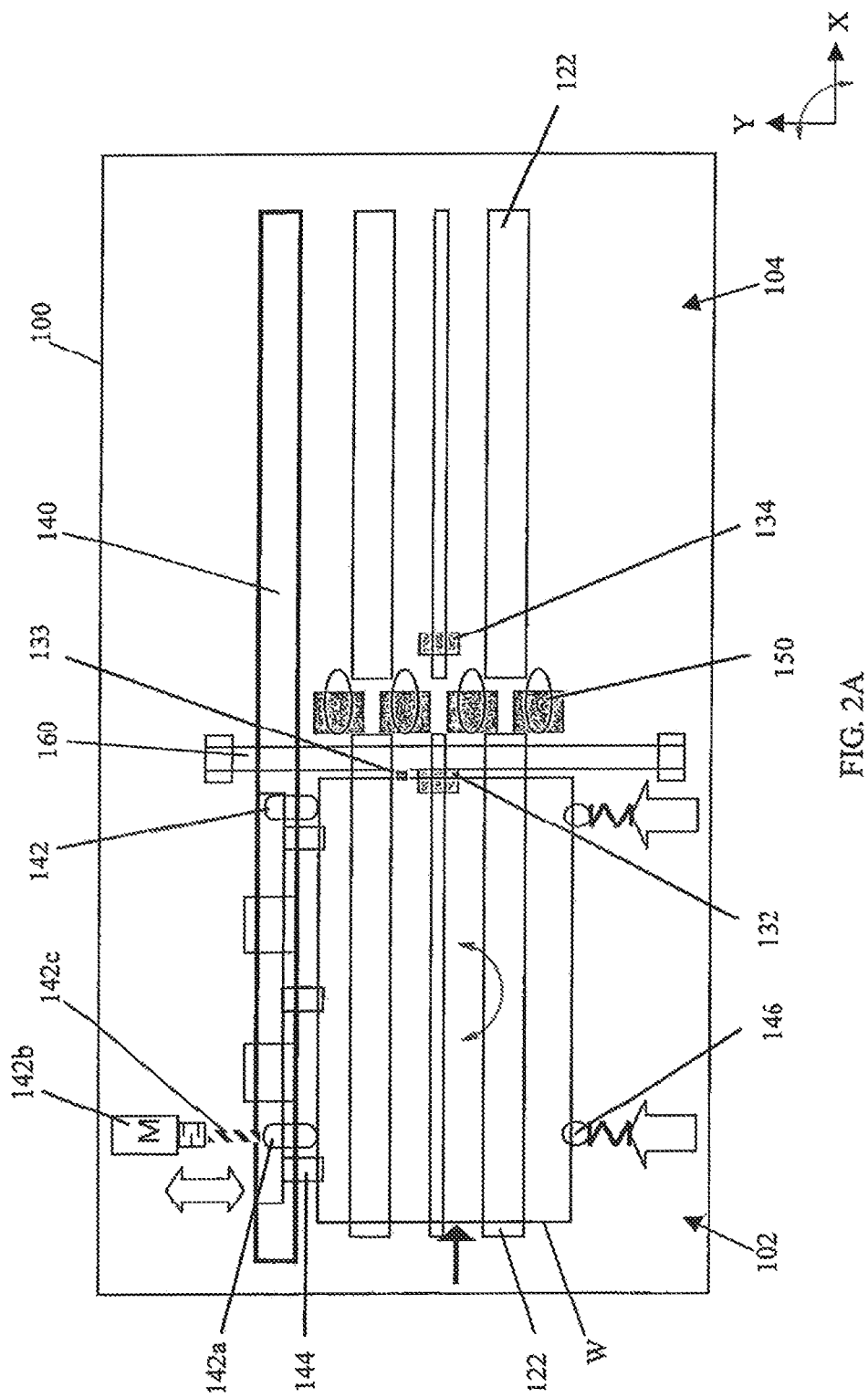
FIG. 2A shows block diagrams of the apparatus shown in FIG. 1A, whilst
Figure 2B:
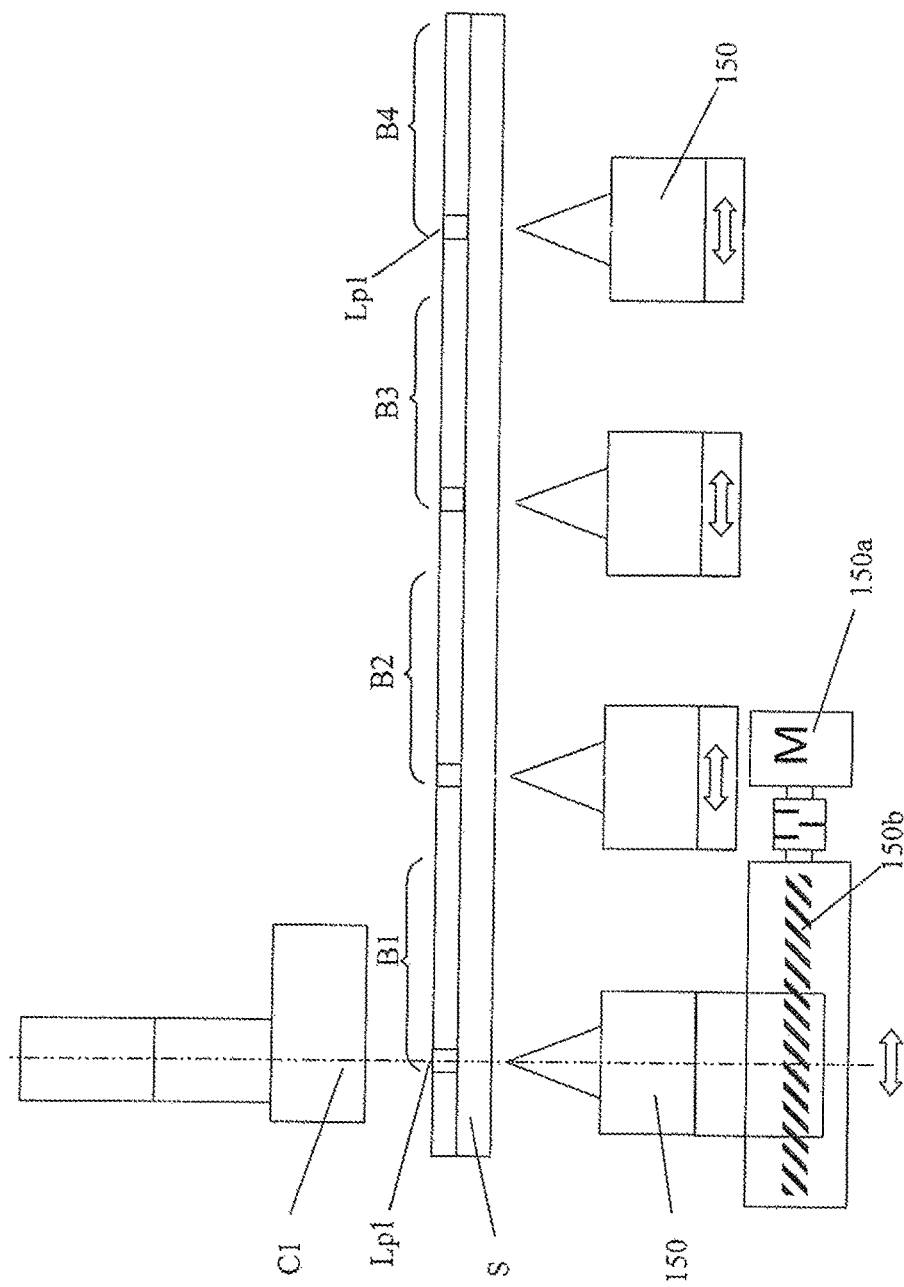
FIG. 2B shows block diagrams of the first laser scribing process.

For clarity, FIGS. 2A-2B show block diagrams of some parts of the apparatus 100 in its plan view with respect to the first laser scribing process P1 on the front electrode. As shown in FIG. 2A, when the substrate S, with the top side formed with the front electrode and orientated to face the gantry 160, is received at the input section 102 of the apparatus 100, the input puller 132, such as a gripper being operable to extend from a retracted position to grip the substrate S, engages the leading end of the substrate S and pulls the substrate into the input section 102 to an input stop position 133. The input stop position 133 is defined by activation of a position sensor, such as, a photoelectric sensor. When the substrate S reaches the input stop position 133, the substrate S is biased by the spring-loaded rollers 146 against the fixed stoppers 142. Whilst the leading edge of the substrate S is at the input stop position 133, the grip on the substrate S changes over from the input puller 132 to the grippers 144 on the linear drive 140. Once the grippers 144 on the linear drive 140 are clamped on the substrate S, the input puller 132 releases its grip and the input puller 132 is retracted, for example, pneumatically; the corresponding position of the linear drive 140 is denoted as a home H position by the servomotor 141 (not shown in the figures) associated with the linear drive 140. Once the substrate S is clamped firmly by the grippers 144, the substrate S is operable to translate between the input and output sections 102,104 whilst the substrate S is supported by the air bearings 122,124. From the home H position, the grippers 144 and linear drive 140 index the substrate S to a process start Ps position. The stroke of movement of the substrate S is defined by the process start Ps position and a process end Pe position. The Ps and Pe positions are set/encoded in the servomotor 141. Once a scribed line Lp1 in each of the four bands B1-B4 is formed on the front electrode, i,e. between the process start Ps position and the process end Pe position, the laser sources 150 are indexed at a pitch of di, in the negative y-direction as indicated by the coordinate system shown in FIGS. 1A and 2A, and a new scribed line Lp1 in each of the four bands B1-B4 is then formed parallel to the respective earlier scribed line Lp1. By indexing the laser sources 150 after forming a laser scribed line and repeating the process P1, the entire substrate S is scribed with lines Lp1 disposed at a uniform pitch di so that the front electrode is isolated, physically and electrically, into substantively parallel strips of uniform widths.

In one embodiment, the pitch di is about 10 mm and the width of the Lp1 scribed lines is about 40-50 microns. In an example, when the substrate is 635 mm wide by 1.4 m long, each band B1-B4 is 150 mm wide and has 15 Lp1 scribed lines. In another example, when the substrate is 1.1 m wide by 1.4 m long, each band B1-B4 is 270 mm wide and has 27 Lp1 scribed lines.

In one embodiment of the apparatus shown in FIGS. 2A-2B, the linear drive 140 moves the grippers 144 back to the process start Ps position after every laser scribing process P1 and scribing is carried out from right to left as seen in FIG. 2A; in another embodiment, the laser scribing process P1 starts from one end and restarts from the opposite end of the substrate, i.e. scribing is carried out in both right and left directions.

In yet another embodiment of the apparatus shown in FIGS. 1A and 2A, the left hand side stopper 142a is made adjustable. The adjustable left hand side stopper 142a, is driven, for example, by a motor 142b and ballscrew 142c; in one embodiment, the motor 142b is a servomotor. A camera C1 is provided near the leading edge of the substrate S to monitor the left hand edge of each substrate, a pre marked reference line or a fiducial near the left hand edge of each substrate S. Another camera C5 is provided near the adjustable left hand side stopper 142a to monitor the left hand, rear edge of the substrate S, the pre-marked reference line or a fiducials near the rear, left hand edge of the substrate S. Parallelism of the left hand edge of the substrate S, pre marked reference line or pair of fiducials near the left hand edge of the substrate S with respect to the linear drive 140 is determined by measuring the deviation of the left hand edge/left hand reference line/pair of fiducials by the cameras C1, C5. If the left hand edge/reference line/pair of fiducials is not parallel to the linear drive 140, this is corrected by adjusting the position of the adjustable left hand stopper 142a with reference to the right hand stopper 142. To correct the position of the adjustable left hand stopper 142a, the motor 142b is programmed to rotate the associated ballscrew 142c an appropriate number of turns so that the edge of the substrate/pre-marked reference line/pair of fiducials on the substrate S is parallel to the linear drive 140 and thus the Lp1 lines to be scribed are parallel to the left hand edge/left hand reference line/pair of fiducials on each substrate S. Such parallelism correction may be carried out regularly. Alternatively, such parallelism determination and correction may be carried out for each batch of substrates S.

In another embodiment, the motor 142b is a stepper motor. In yet another embodiment, the motor 142b is a piezoelectric motor; the piezoelectric motor may be connected directly to the adjustable stopper 142a.

As described, the laser sources 150 are operable to index at pitch di transversely from the direction of a scribed line Lp1,Lp2 but independently of each other. In another method to scribe straight lines parallel to the edge of the substrate/pre-marked reference line/pair of fiducials on the substrate, a laser source 150 may be indexed at a predetermined rate, for example, to compensate for any error in setting the two fixed stoppers 142; such error is determined by the cameras C1,C5 and parallelism correction is carried out dynamically during the P1,P2,P3 scribing process. The laser sources 150 may be mounted on a platform, which is movable on linear guides; this allows the laser sources 150 and associated platform to be moved out of their positions, for example, for ease of maintenance. In another embodiment, there are two or more such platforms so that one or more laser sources 150 may be moved in different directions from the other laser sources for more ease of maintenance.

Figure 2C:
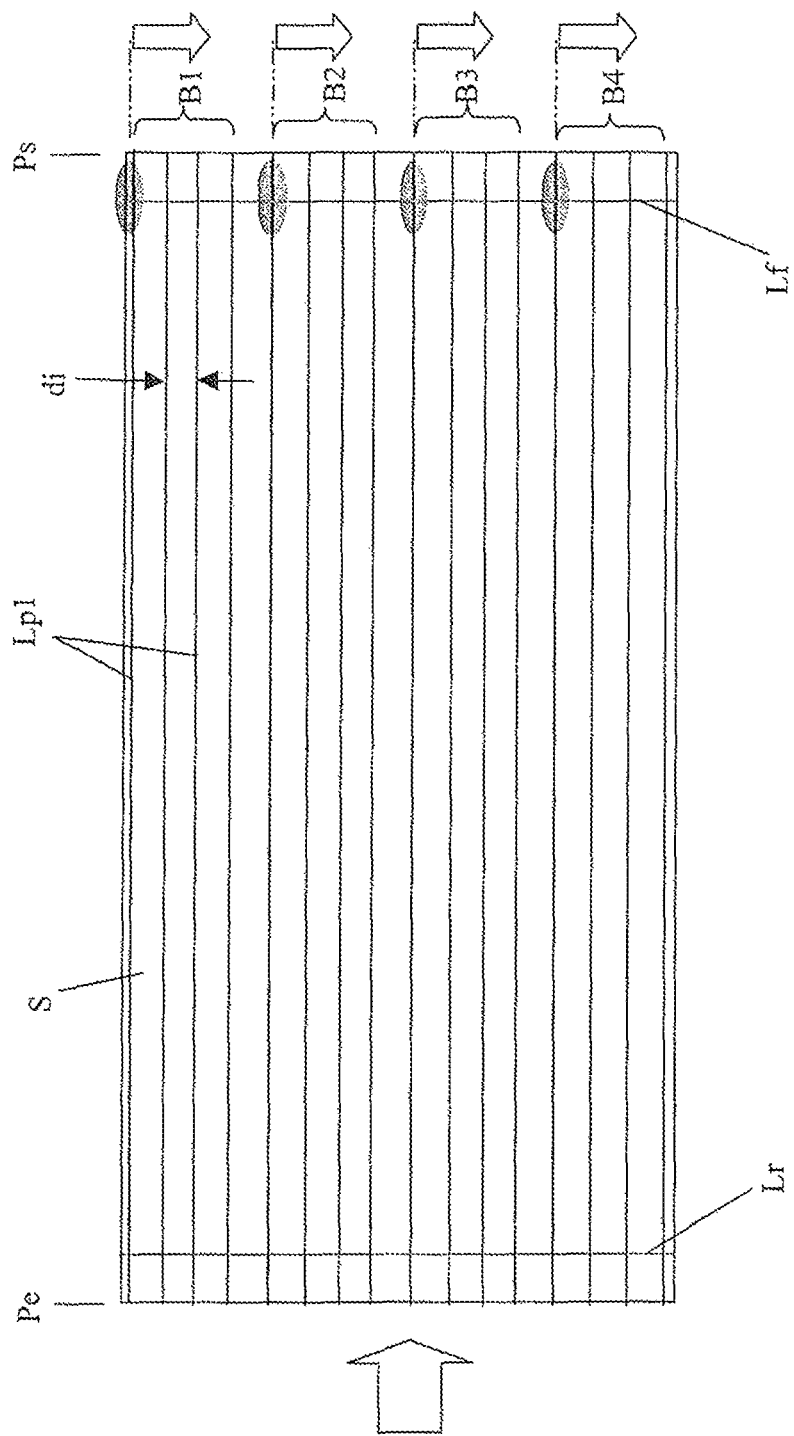
FIG. 2C shows a substrate after the first laser scribing process.

FIG. 2C shows a substrate S with the front electrode being divided into substantively parallel strips of uniform widths after undergoing the P1 scribing process with the laser sources 150 irradiating laser beams of about 1064 nm wavelength. At the end of P1 process, if grippers 144 end up at the process start Ps position, the linear drive 140 indexes the grippers 144 and the substrate S to a front isolation Pf position. The front isolation Pf position is a predetermined distance, for example 10 mm, short of the process start Ps position. With the substrate S in the Pf position, each of the lasers sources 150 is indexed to its respective left hand travel position. The lasers sources 150 are then operated to fire the respective laser beams on the substrate whilst the laser sources 150 are indexing at a constant speed in a left to right hand direction according to the arrows shown in FIG. 2C such that a continuous isolation line Lf is formed near the leading edge of the substrate S, as shown in FIG. 2C. After the front isolation line Lf is formed, the linear drive 140 indexes the grippers 144 and the substrate S to a rear isolation Pr position. The rear isolation Pr position is a predetermined distance, for example 10 mm, short of the process end Pe position. The laser sources 150 are then operated to fire the respective laser beams on the substrate S whilst the laser sources 150 are indexing in a left to right hand direction so that a continuous rear isolation line Lr is formed near the rear end of the substrate S.

Alternatively, at the end of the P1 process, laser sources 150 remain at their respective right hand travel positions and if substrate S is at the front isolation Pf position, the laser sources 150 are fired and indexed at a constant speed in a right to left hand direction as seen in FIG. 2C. After the front isolation line Lf is scribed, the linear drive 140 indexes the grippers 144 to the rear isolation Pr position and the laser sources 150 are then fired and indexed at a constant speed from the left to right hand direction. Alternatively, the laser sources 150 are moved back to the respective home positions and they are indexed in a left to right hand direction when scribing the Lf and Lr isolation lines.

Figure 3A:
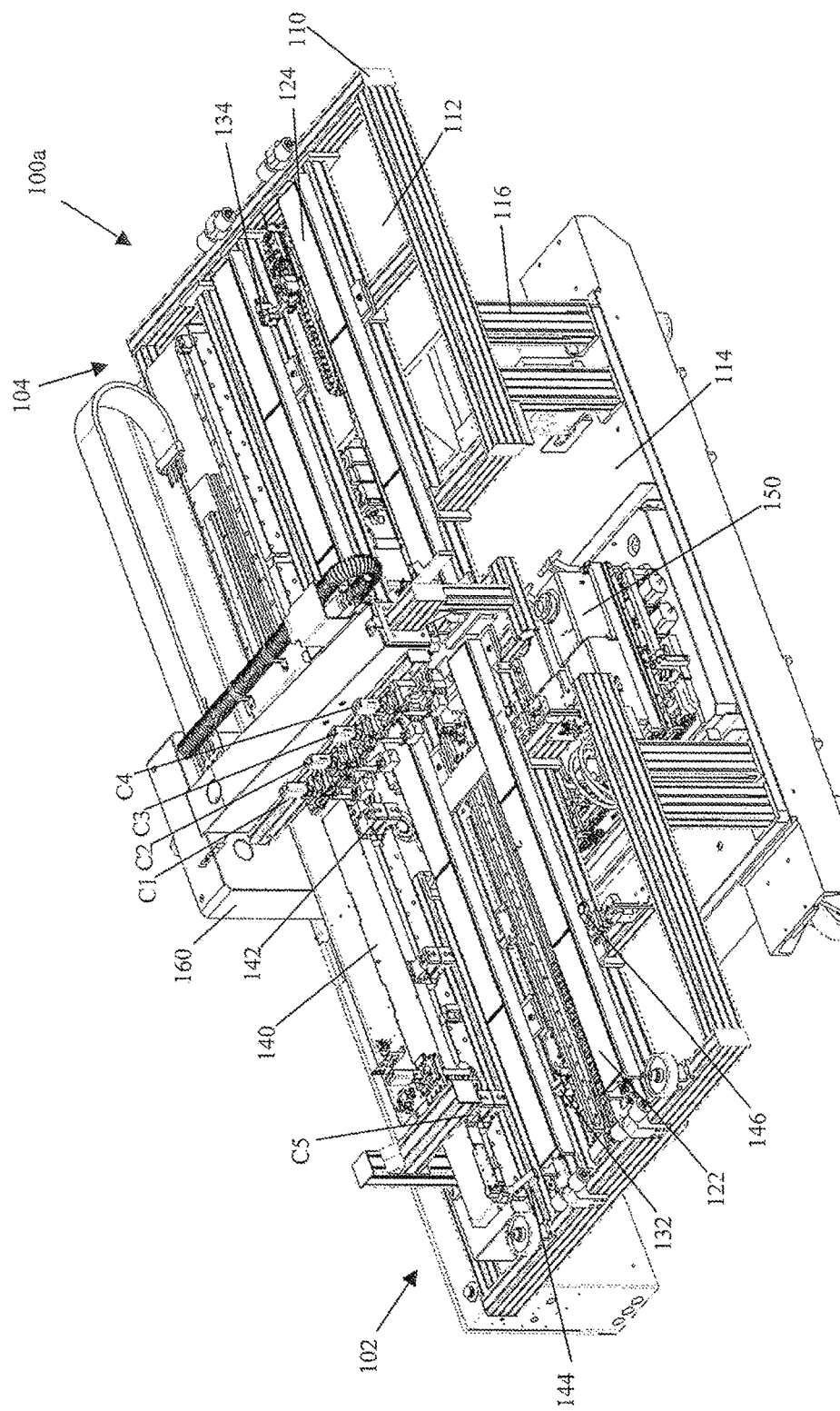
FIG. 3A shows an apparatus for laser scribing of the semiconductor layer and rear electrode according to another embodiment of the present invention, whilst
Figure 3B:
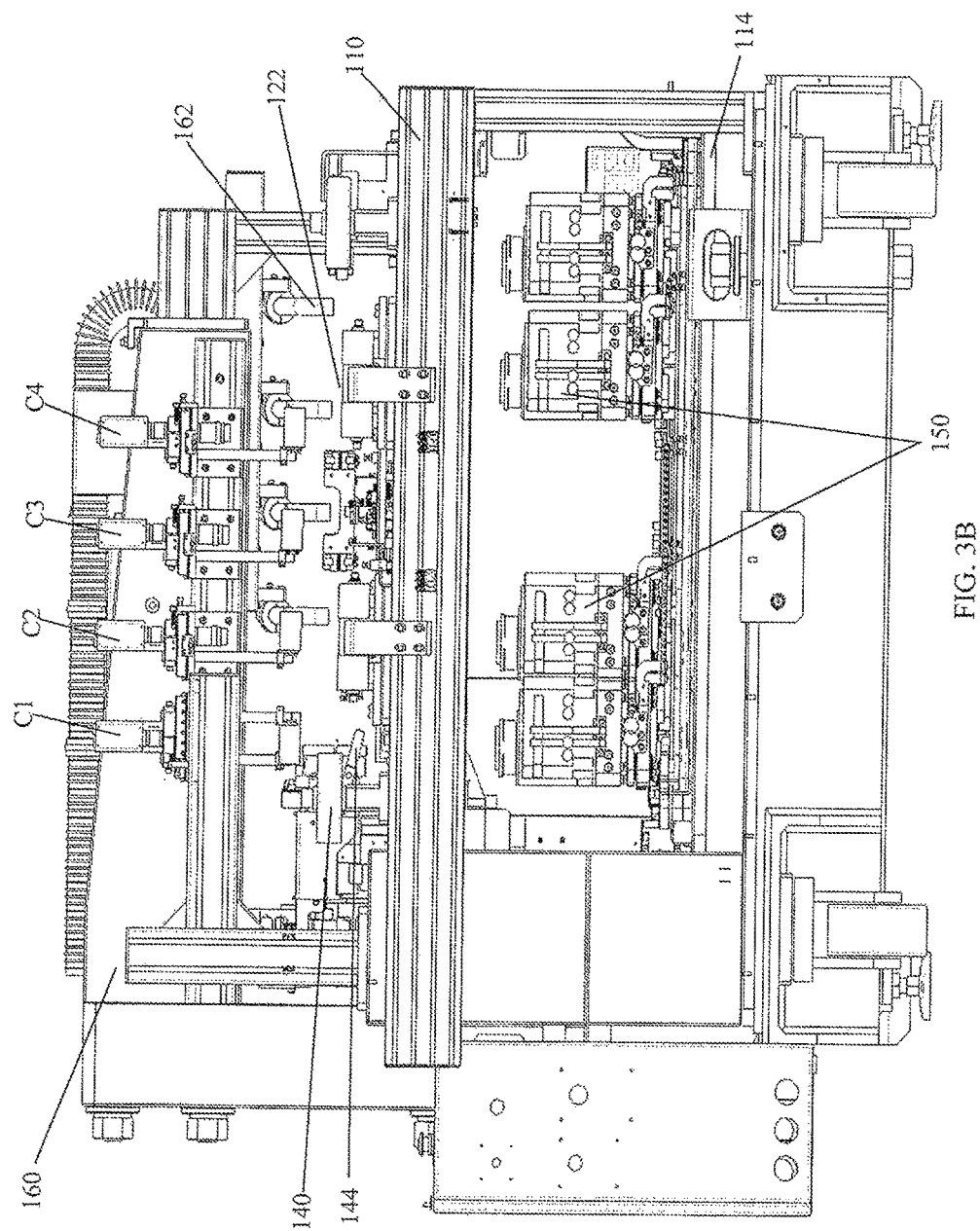
FIG. 3B illustrates an end view of the apparatus shown in FIG. 3A.

FIG. 3A shows a laser scribing apparatus 100a according to another embodiment of the present invention. FIG. 3B shows an end view of the apparatus 100a. As shown in FIGS. 3A and 3B, the laser scribing apparatus 100a is similar to the first scribing apparatus 100 with rear, adjustable stopper 142a except that the laser scribing apparatus 100a has additional cameras C1-C4 mounted on the gantry 160. The cameras C1-C4 are associated with the four respective laser sources 150. The laser scribing apparatus 100a may be suitable for the P2 and P3 scribing processes and is advantageous if parallelism of to-be-scribed lines need to be monitored and corrected with reference to a previously scribed line. For example, after the front electrodes are divided into parallel strips and the PN junction/semiconductor layer is formed over the strips of front electrodes, the partially processed workpiece W is transferred onto the input section 102 of apparatus 100a. The input puller 132 then pulls the workpiece W to the input stop 133 position and the spring-loaded rollers 146 then push the workpiece W against the left hand side stoppers 142,142a. When the leading edge of the workpiece is at the input stop position 133, the grip on the workpiece changes over from the input puller 132 to the grippers 144. Once the grippers 144 on the linear drive 140 are clamped on the workpiece W, the input puller 132 releases its grip and the input puller 132 is retracted. Parallelism setting is first conducted to align the scribed lines Lp1 previously formed on the front electrode with the linear drive 140. In the parallelism setting, the grippers 144 translate the workpiece W along the linear drive 140 and the cameras C1 and C5 determines the amount and side of deviations, if any, of the scribed line Lp1 at the leading edge of the workpiece from the rear edge. Once the deviation is determined, the workpiece W is translated to the process start Ps position and the position of the rear, adjustable stopper 142a is corrected to ensure parallelism of the scribed lines Lp1 with the linear drive 140 before the P2 scribing of the PN junction/semiconductor layer is carried out. Similarly, a parallelism setting is conducted to align the scribed lines Lp2 with the linear drive 140 before the P3 scribing process is started. By carrying out these parallelism settings, parallelism of the to-be-scribed lines Lp2,Lp3 with the relevant previously scribed lines Lp1,Lp2 is substantively certain. After the parallelism settings, the positions of the laser sources 150 with respect to the previously scribed lines are also corrected, when necessary, by offsetting the relevant laser sources 150 with the respective deviations obtained from the cameras C1-C4 so that the desired pitch di is maintained.

Alternative to the above parallelism determination and correction, a dummy substrate or workpiece is used for manual calibration of the scribed lines Lp1,Lp2. The dummy substrate is transferred onto the input section 102,102a. The left hand edge of the dummy substrate is then clamped by the grippers 144 and moved to the process start Ps position. All the four laser sources 150 are fired while the linear drive 140 translates the dummy plate to the process end Pe position. The four scribed lines Lp1,Lp2 are then measured for parallelism with the left hand edge/left hand reference line/pair of fiducials and the pitch is determined. To correct parallelism with the linear drive 140, the position of the adjustable stopper 142a is adjusted by rotating the servo-motor 142b by an appropriate number of turns. Similarly, the positions of each laser source 150 is adjusted to correct any errors in the line pitch di. Such manual calibration may be carried out for each batch of solar cell panels.

In yet another embodiment, automatic line pitch determination and correction is provided. For automatic line pitch determination and correction, each of the cameras C1-C4 is mounted on individual motorized y-axis. For initial setting of the cameras C1-C5 so that a workpiece is parallel to the linear drive 140 and the cameras C1-C5 are in their respective positions, a precision jig plate is used. On the precision jig plate, there is a line in each of the four bands B1-B4 that correspond to each of the laser sources 150 and cameras C1-C4. The four lines are substantively parallel to each other and with the left hand edge/reference line/pair of fiducials. During calibration, a camera C1-C4 captures an image of an associated scribed line Lp1,Lp2 and travels to capture an image of an adjacent scribed line to determine the line pitch di. If there is an error in the line pitch di, the position of the motor connected to the relevant camera is corrected by rotating it an appropriate number of turn.

Figure 4A:
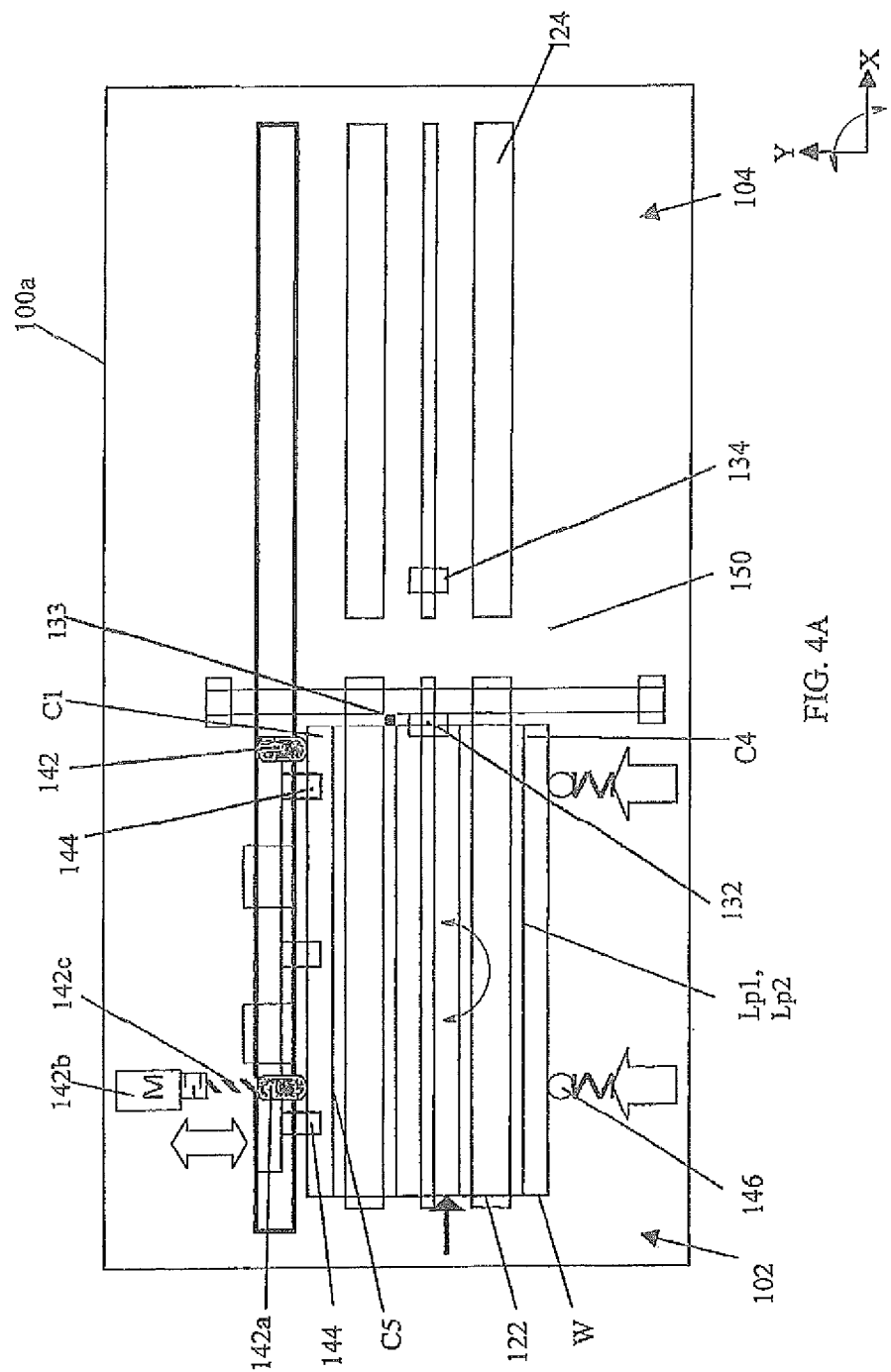
FIG. 4A shows block diagrams of the apparatus shown in FIG. 3.
Figure 4B:
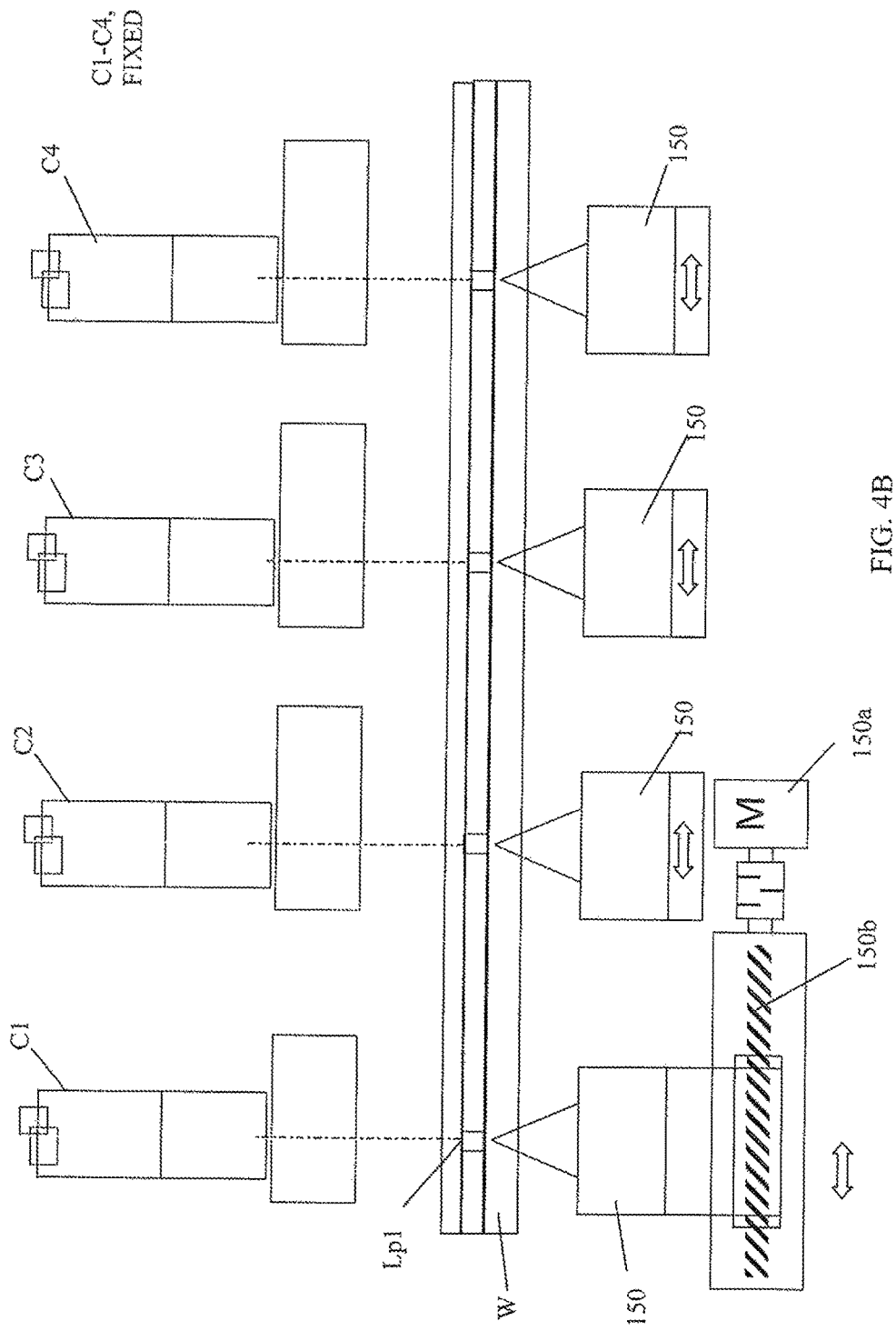
FIGS. 4B and 4C show block diagrams of the second laser scribing process.
Figure 4C:
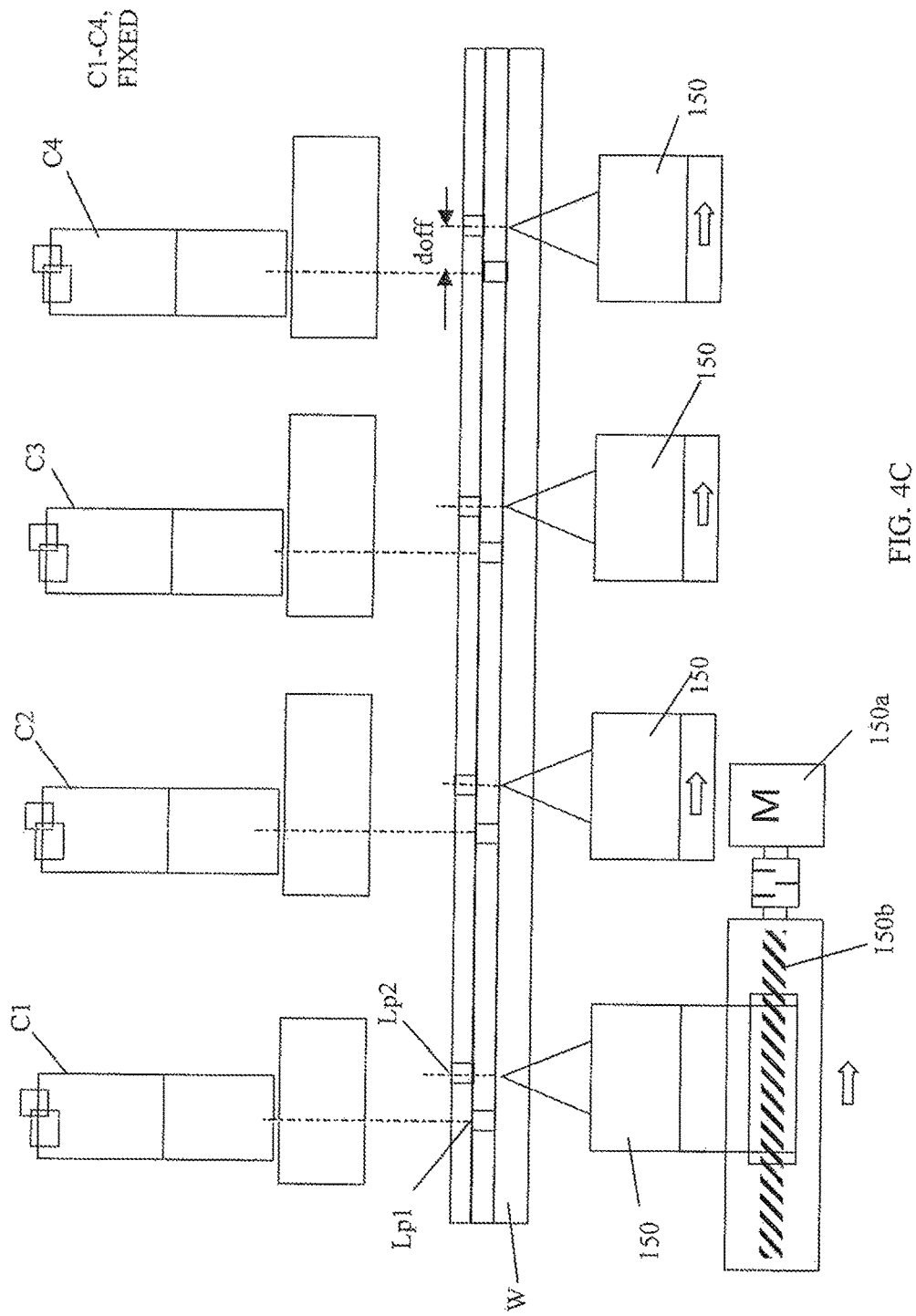

FIG. 4A shows block diagrams of some of the parts of the apparatus 100a in its plan view. FIG. 4B shows alignment of the laser sources 150 with the respective scribed lines Lp1 on the front electrode, whilst FIG. 4C shows the P2 scribing of the semiconductor layer by the laser beams going through the substrate S and front electrode with the respective laser sources 150 being offset doff from the Lp1 scribed lines. In one embodiment, the offset doff is about 100 microns when the P2 scribed lines are about 60-80 microns wide. During the P2 scribing process, the laser beams are modulated to shorter wavelengths, for example from about 500 to about 600 nm, so that the laser beams pass through both the substrate and front electrodes but are absorbed by the semiconductor layer. As a result of absorption of the laser energy by the semiconductor layer, the semiconductor layer is ablated and Lp2 scribed lines are formed, thereby dividing the semiconductor layer into strips of uniform widths parallel to the strips of the front electrodes.

In addition or alternative to the above calibration at the start of each scribing process P2,P3, calibration of a new scribe line against a previously scribed line is carried out dynamically during the relevant scribing process.

Figure 5A:
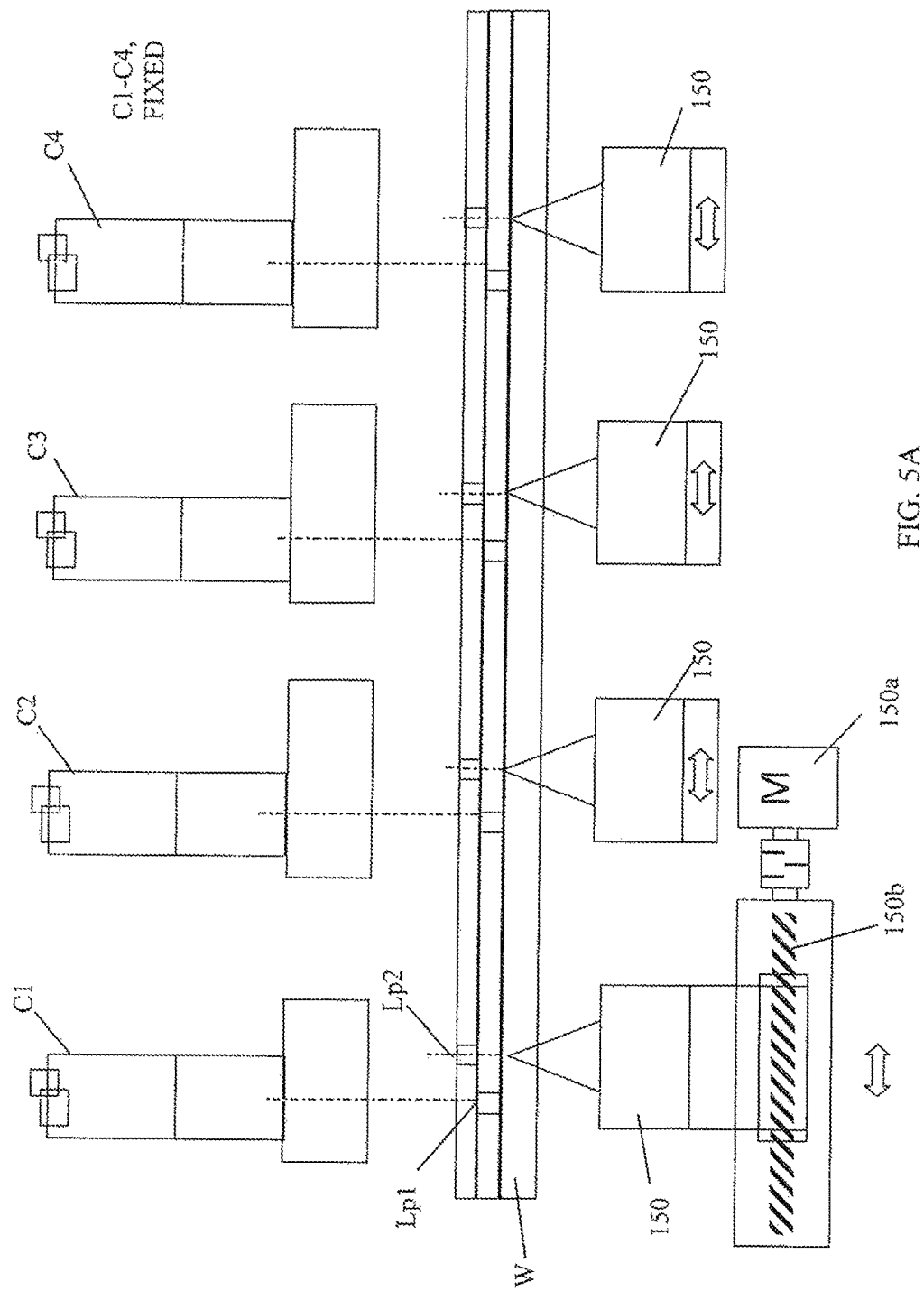
FIGS. 5A-5B show block diagrams of the third laser scribing process.
Figure 5B:
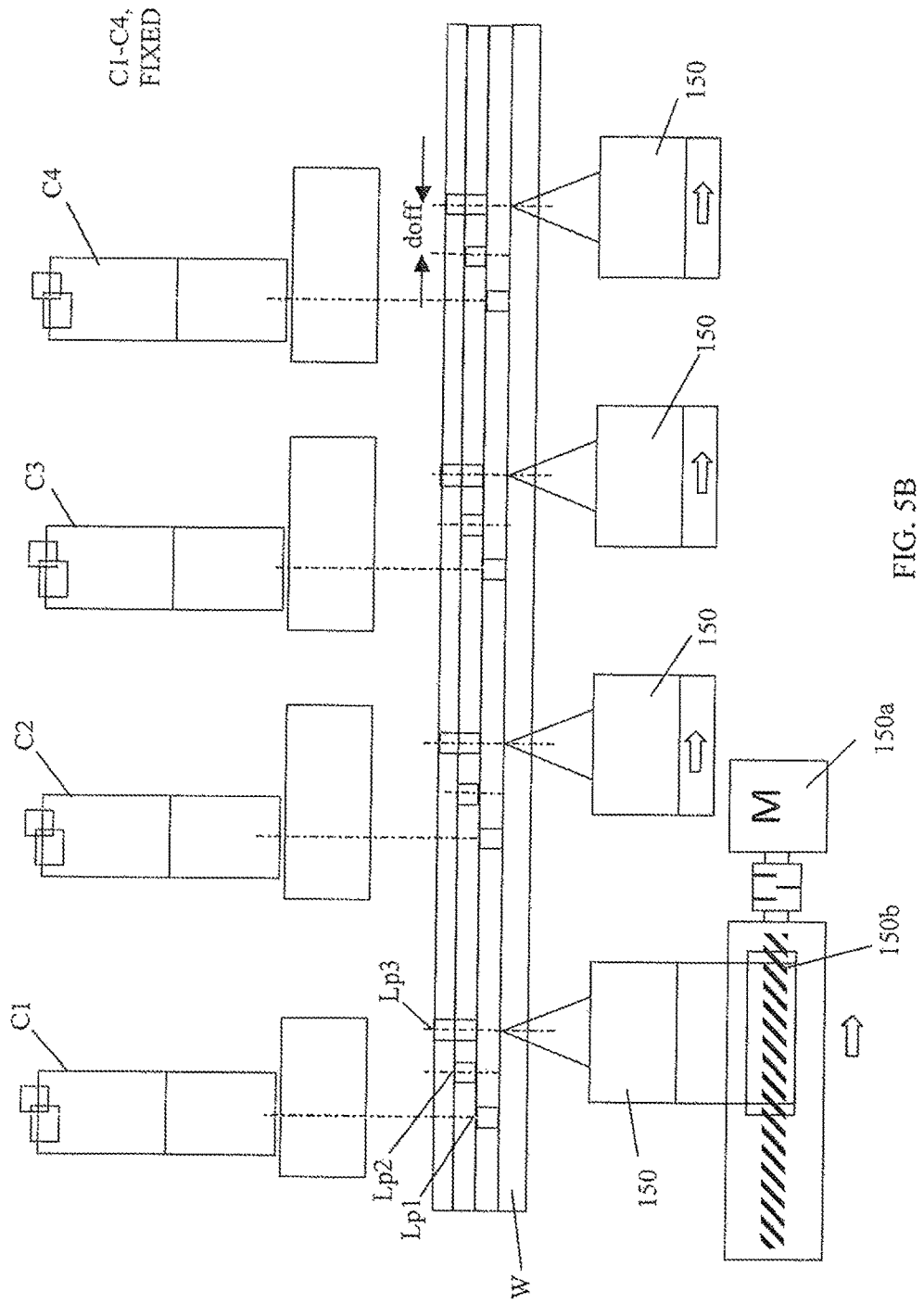

The apparatus 100a is also used to scribe lines Lp3 on the rear electrode with reference to the scribed lines Lp2 on the PN junction/semiconductor layer. In this process P3, scribing of the rear electrode is by firing laser beams through the substrate S and front electrode such that the laser beam is absorbed by the semiconductor layer. Due to the explosive ablation of the semiconductor layer, both the semiconductor layer and rear electrode are ablated, thereby forming a scribed line Lp3. Operation of the scribed lines Lp3 on the rear electrode with reference to the scribed lines Lp2 on the PN junction/semiconductor layer is similar to the above description for P2 scribing the semiconductor layer and therefore no further description is provided. In one embodiment, the Lp3 scribed lines are offset doff about 100 microns from the Lp2 lines when the width of the Lp3 lines are about 60-80 microns. FIG. 5A shows alignment of the laser sources 150 with respect to the scribed lines Lp2 on the semiconductor layer, whilst FIG. 5B shows the scribing P3 of the rear electrodes by laser beams going through the substrate S and front electrode and ablating both the semiconductor layer and rear electrode.

In the above laser scribing P2,P3 of the semiconductor layer and semiconductor layer/rear electrodes, after the first scribed line Lp2,Lp3 is formed in each of the four bands B1-B4, the linear drive 140 and grippers 144 moves the partially processed workpiece to the start process Ps position and laser scribing P2,P3 is carried out from right to left as seen in FIG. 4A. In another embodiment, the laser scribing process P2,P3 is carried out in both right and left directions. After an entire workpiece is processed, the workpiece W is translated into the output section 104 for removal from the apparatus 100a.

Figure 6A:
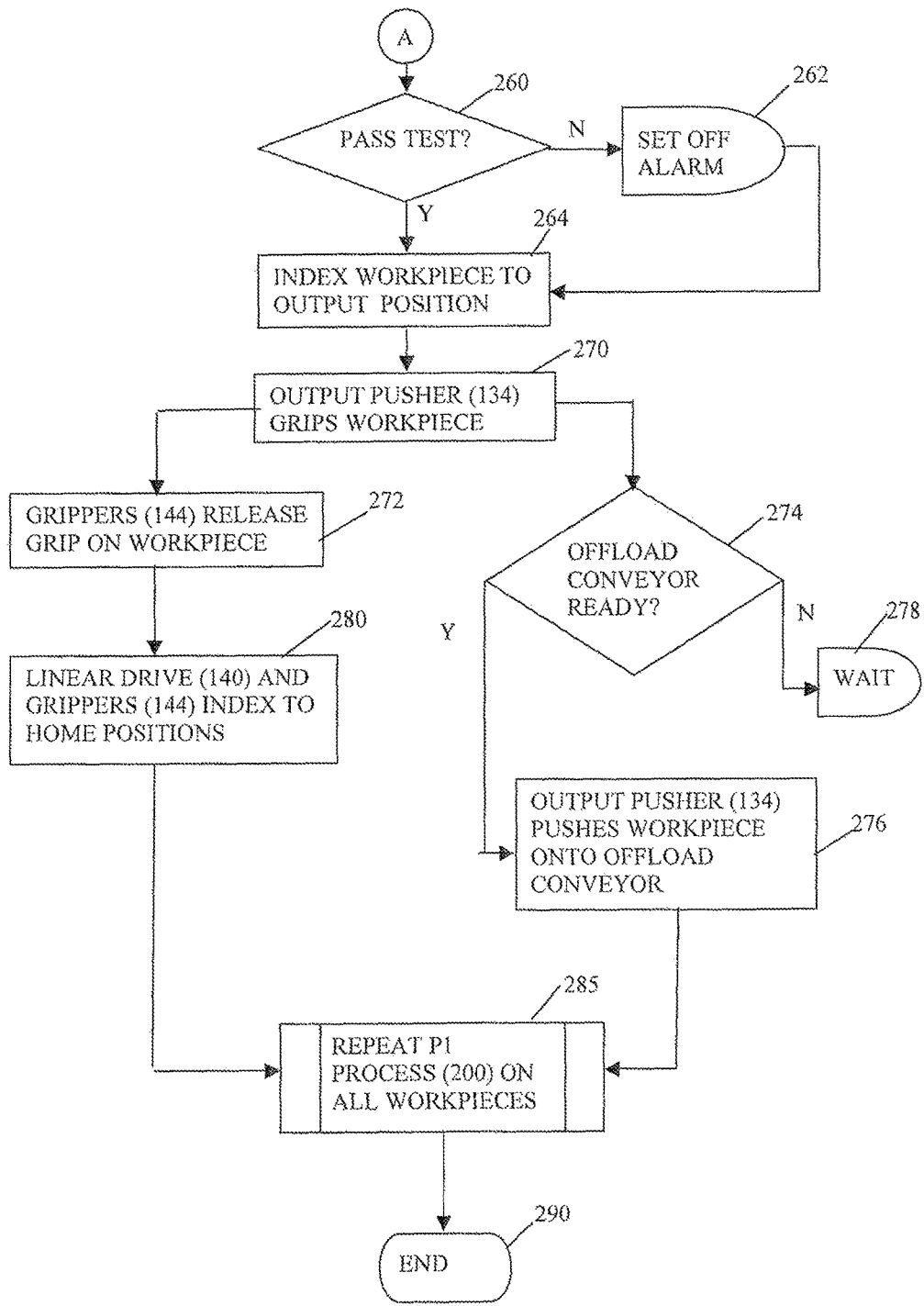
FIG. 6A shows the process flow for laser scribing of the front electrode.

FIG. 6A illustrates the process flow 200 of apparatus 100 according to another embodiment of the present invention. As shown in FIG. 6A, the process flow 200 starts at step 201. In the next step 202, the apparatus 100 requests a workpiece. In step 204, an input conveyor (connected to the input section 102 of apparatus 100) responds by feeding the workpiece into the input section 102. The input puller 132 then grips the workpiece and pulls it to the input stop position 133, in step 206. The input puller gripper 132 releases its grip and retracts, and at the same time, in step 208, the spring loaded rollers 146 are activated to bias the workpiece against the stoppers 142,142a. Next, in step 209, the grippers 144 on the linear drive 140 grip the workpiece. The cameras C1, C5 are then activated, in step 210, to capture any parallelism deviation of the workpiece with the linear drive. If parallelism correction is required, the grippers 144 are then released whilst the motor 142b adjusts the adjustable stopper 142a. The grippers 144 are activated again and the cameras C1,C5 again capture any parallelism deviation of the workpiece with the linear drive; such parallelism deviation and correction may be repeated, in step 210, until the workpiece is aligned with the linear drive 140. Once the workpiece is aligned with the linear drive 140, the grippers 144 on the linear drive 140 then grip the aligned workpiece. Next, in step 217, the spring loaded rollers 146 retract, and in step 218, the linear drive indexes from its home position to the process start Ps position.

At the process start position, the laser sources 150 are activated to fire the respective laser beams on the workpiece; at the same time, the linear drive 140 is activated to move at a constant speed, in step 220. In step 222, the linear drive reaches the process end Pe position and the laser sources are deactivated. In the next step at 224, the laser sources 150 are indexed to the next pitch by a distance of di. In the following step at 226, the laser sources are reactivated whilst the linear drive 140 indexes the workpiece back at a constant speed to the process start Ps position to scribe another Lp1 line parallel to the earlier one. The scribing process P1 is repeated in step 230 until the entire workpiece is scribed with uniform and parallel lines Lp1. Following process P1, the linear drive 140 indexes, in step 232, the workpiece to the front isolation Pf position. At the Pf position, the laser sources are activated whilst the laser sources are respectively indexed at a constant speed in the negative y-direction to scribe the front isolation line Lf. Next, in step 240, the linear drive indexes the workpiece to the rear isolation Pr position and the laser sources are activated to scribe the rear isolation line Lr. Following these steps, the P1 laser scribing process is completed in step 245. In the next step at 250, the linear drive indexes the workpiece into the output section 104 and the gang resistance tester 190 is activated in step 252. A decision in step 260 is then made whether the strips of the front electrodes divided after process P1 are electrically isolated one from another. If the decision is negative, an alarm is activated in step 262 before the linear drive moves the workpiece to its output position in step 264. If the decision in step 260 is positive, the workpiece is move, in step 264, to its output position.

Once the workpiece is at the output position, the output pusher 134 is activated in step 270 to grip the workpiece and the grippers 144 release their grip in step 272. At the same time, a decision in step 274 is made whether the offload conveyor (not shown in the figures) connected to the output section 104 is available. If the decision in step 274 is negative, the process 200 waits for the offload conveyor to be available. If the decision in step 274 is positive, the output pusher 134 pushes the process workpiece onto the offload conveyor and repeats, in step 285, the process 200 on another workpiece. Before a new workpiece is processed, the linear drive 140 indexes the grippers 144 to their home positions in the input section, in step 280. Once all the workpieces are scribed with Lp1 lines on the front electrode, the process ends at step 290.

Figure 6B:
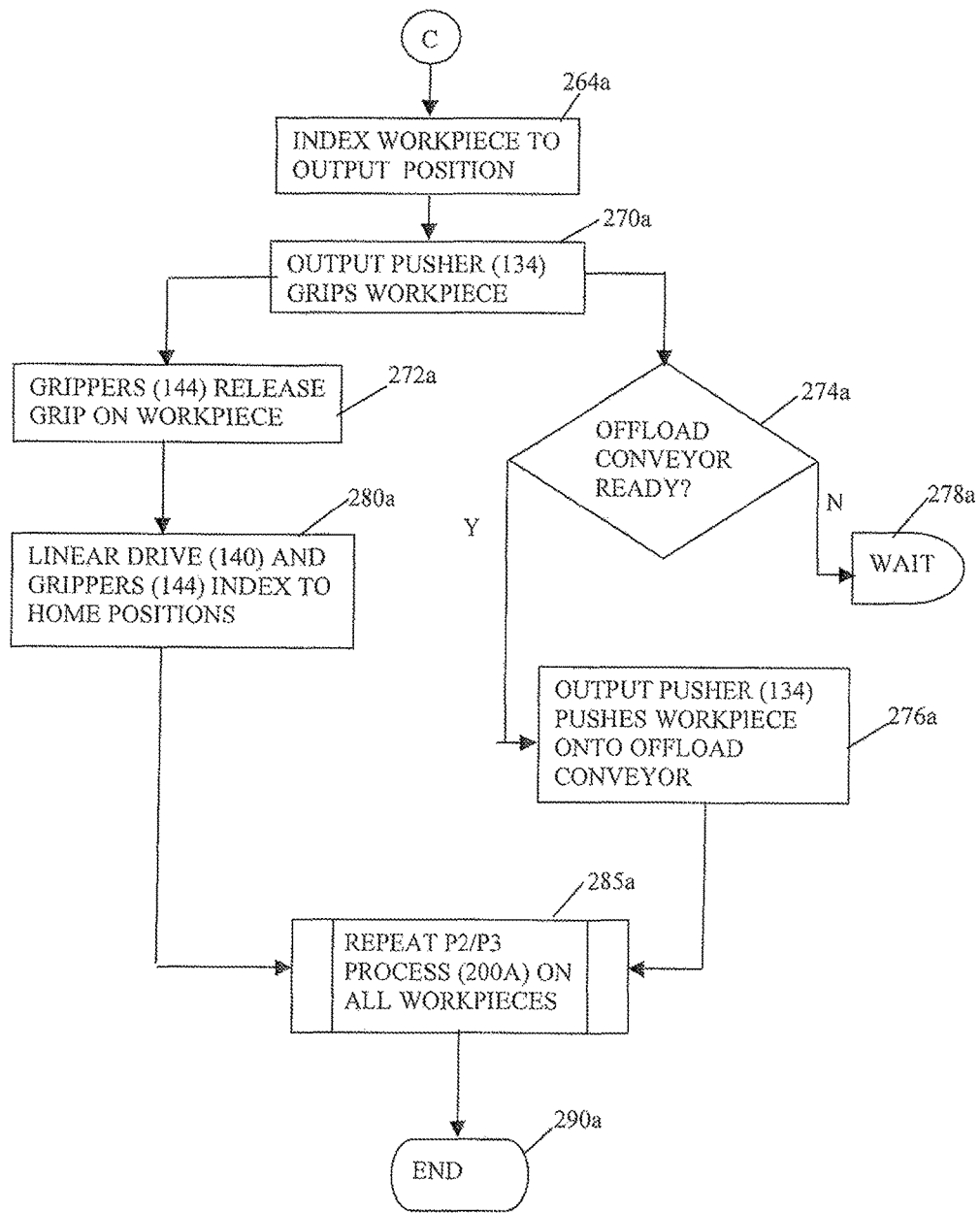
FIG. 6B shows the process flow for laser scribing of the semiconductor layer and rear electrode.

FIG. 6B illustrates the process flow 200a of apparatus 100a according to yet another embodiment of the present invention. The process flow 200a is similar to that of process 200 except the cameras C1-C4 perform additional line alignment process and there is no gang resistance test. For purposes of description, similar process steps are identified by similar reference numerals and only the different steps in FIG. 6B are described. As shown in FIG. 6B, in step 210a, the cameras C1-C5 are activated to capture any parallelism deviation of the workpiece with the linear drive 140. Once workpiece parallelism deviation and correction are made, the grippers 144 grip the workpiece. A decision is then made in step 211 whether the laser sources 150 are aligned with a previously scribed line. If the decision is negative, the motor 150a connected to each laser source 150 corrects line alignment with a previously scribed line P1,P2 and the motor 150a then offsets doff the respective laser source from the relevant previously P1,P2 scribed line. Once this line alignment correction and laser offset are carried out, spring loaded rollers 146 retract and process 200a continues. In step 230a, scribing of all the P2 and/or P3 lines are repeated, and the process 200a is repeated in step 285a until all the workpieces are laser scribed before the process 200a ends in step 290a.

While specific embodiments have been described and illustrated, it is understood that many changes, modifications, variations and combinations thereof could be made to the present invention without departing from the scope of the invention. For example, a leadscrew may be used instead of a ballscrew, a stepper motor may be used instead of a servomotor, and a linear motor may be used instead of a linear drive. In addition, the laser sources may produce laser beams that are longitudinal with respect to the long dimensions of the laser sources and mirrors are used to bend the laser beams upwardly through the space between the input and output sections. Although four laser sources 150 have been described, it is not so limited; two or more laser sources may be employed in order to achieve a reasonable throughput. In addition, the apparatus 100,100a is described for handling 635 mm×1400 mm panels; to handle larger panels such as 1100 mm—1400 mm panels or bigger panels, more than two rows of air bearings in each of the input and output sections would be required and the width and/or length of the machine is/are changed accordingly; in addition, another linear drive acting as a slave is provided parallel to the linear drive 140. The slave linear drive also has grippers to ensure that the workpieces do not shift during the laser scribing process.

What is claimed is:

1. A laser scribing process for the manufacture of a thin-film solar panel, the process comprising:
    loading a planar workpiece with a transparent substrate facing downwards in an input station of a laser scribing machine;
    biasing a reference edge of the planar workpiece to contact both a fixed stopper and an adjustable stopper associated with a linear drive, wherein the linear drive is operated to translate the planar workpiece between the input station and an output station;
    determining amounts of deviations of the reference edge or a reference line at the reference edge from the linear drive from a front end to a rear end of the planar workpiece, and adjusting the adjustable stopper accordingly by rotating the planar workpiece in a flat plane spanning the planar workpiece so as to correct parallelism of the reference edge or reference line with the linear drive;
    translating the planar workpiece back and forth between the input station and the output station and firing a laser beam at a first frequency vertically through a space between the input and output stations to pass through the transparent substrate of the planar workpiece to scribe parallel lines (LP1) on a front electrode layer, which is disposed on an upper face of the transparent substrate, wherein the laser beam is outputted from a laser source that is mounted on an independently motorized axis disposed transverse to the linear drive; and
    indexing the laser source at a predetermined pitch transversely to the linear drive and repeating the back and forth translation of the planar workpiece between the input and output stations until the entire front electrode layer is divided into parallel strips of a uniform width that are electrically isolated one from another;
    providing a number of laser sources and dividing an area of laser scribing on the planar workpiece into a number of gangs according to the number of laser sources, and conducting laser scribing on the planar workpiece simultaneously in the respective gangs;
    the method further comprising:
    reloading the planar workpiece formed with parallel, uniform strips of the front electrode layer and disposed with a new semiconductor layer or a rear electrode layer in the input station;
    biasing the reference edge of the planar workpiece to contact both the fixed stopper and the adjustable stopper;
    aligning a scribed line (Lp1) on the front electrode layer with the linear drive by using a measuring camera (C1-C4) disposed above the planar workpiece and another measuring camera (C5) disposed near the adjustable stopper to determine a correction required to align parallelism between the scribed line (Lp1) with the linear drive, adjusting the adjustable stopper accordingly by rotating the planar workpiece in the flat plane to achieve the required parallelism, and adjusting position of each of the laser sources, when necessary, to achieve scribing strips of a uniform width;
    translating the workpiece back and forth between the input station and output station and firing laser beams at a second frequency vertically through the space between the input and output stations to pass through the transparent substrate of the planar workpiece to scribe parallel lines (Lp2, Lp3) on the semiconductor layer or rear electrode layer parallel to the previously scribed lines (Lp1 or Lp2); and
    indexing the laser sources, and repeating the back and forth translation of the planar workpiece between the input and output stations until the entire semiconductor layer or rear electrode layer is divided into parallel strips of a uniform width that are electrically isolated one from another.

2. The laser scribing process according to claim 1, wherein parallelism alignment is carried out manually with a dummy workpiece.

3. The laser scribing process according to claim 1, wherein determining amounts of deviations of the reference edge or reference line from the linear drive is carried out with at least one of the measuring camera or the another measuring camera, and the planar workpiece parallelism alignment is carried out at a beginning of each laser scribing step.

4. The laser scribing process according to claim 1, wherein the planar workpiece parallelism alignment is carried out with a precision jig.

5. The laser scribing process according to claim 1, wherein the planar workpiece parallelism alignment is carried out dynamically during the laser scribing process.

6. The laser scribing process according to claim 1, further scribing a front isolation line (Lf) and a rear isolation line (Lr).

7. A laser scribing process for the manufacture of a thin-film solar panel, the process comprising:
    loading a planar workpiece with a transparent substrate facing downwards in an input station of a laser scribing machine;
    biasing the planar workpiece so that a reference edge of the planar workpiece contacts both a fixed stopper and an adjustable stopper associated with a linear drive; wherein the linear drive is operated to translate the planar workpiece between the input station and an output station;
    aligning a reference line or a reference edge of the planar workpiece with the linear drive by using a measuring camera (C1-C4) disposed above the planar workpiece and another measuring camera (C5) disposed near the adjustable stopper to determine a correction required to achieve parallelism between the reference line or reference edge with the linear drive, and adjusting the adjustable stopper accordingly by rotating the workpiece in a flat plane spanning the planar workpiece to achieve the required parallelism between the reference line or reference edge with the linear drive;

translating the planar workpiece back and forth between the input station and the output station and firing two or more laser beams at a first frequency vertically, through a space between the input and output stations, through the transparent substrate of the planar workpiece to scribe parallel lines (LP1) on a front electrode layer disposed on an upper face of the transparent substrate; wherein each of the two or more laser beams is outputted from a separate laser source, which each laser source is mounted on an independently motorized axis disposed transverse to the linear drive;

indexing the two or more laser sources at predetermined pitches transverse to the linear drive, and repeating the back and forth translation of the planar workpiece between the input and output stations until the entire front electrode layer is divided into parallel strips of a uniform width that are electrically isolated one from another;

aligning a scribed line (Lp1) on the front electrode layer with the linear drive by using the measuring camera (C1-C4) disposed above the planar workpiece and the another measuring camera (C5) disposed near the adjustable stopper to determine a correction required to achieve parallelism between the scribed line (LP1) with the linear drive, and adjusting the adjustable stopper accordingly by rotating the planar workpiece in the flat plane to achieve parallelism; wherein each of the measuring cameras is mounted on an independently motorized axis disposed transverse to the linear drive;

adjusting positions of the two or more laser sources, when necessary, to achieve scribing strips of a uniform width;

translating the workpiece back and forth between the input station and the output station and firing two or more laser beams at a second frequency vertically, through the space between the input and output stations, through the transparent substrate of the planar workpiece to scribe parallel lines (Lp2, Lp3) on a new semiconductor layer or a rear electrode layer disposed on the planar workpiece; and indexing the two or more laser sources, and repeating the back and forth translation of the planar workpiece between the input and output stations until the entire semiconductor layer or rear electrode layer is divided into parallel strips of a uniform width that are electrically isolated one from another.

8. The laser scribing process according to claim 7, wherein parallelism alignment is carried out manually with a dummy workpiece.

9. The laser scribing process according to claim 7, wherein the planar workpiece parallelism alignment is carried out with a precision jig at the beginning of each laser scribing step.

10. The laser scribing process according to claim 7, wherein the planar workpiece parallelism alignment is carried out dynamically during the laser scribing process.

11. The laser scribing process according to claim 7, further scribing a front isolation line (Lf) and a rear isolation line (Lr).

* * * * *